(12) United States Patent
Wu

(10) Patent No.: US 8,576,575 B2
(45) Date of Patent: Nov. 5, 2013

(54) PRINTED CIRCUIT AND PRINTED CIRCUIT OF TOUCH PANEL

(71) Applicant: Ho-Chien Wu, Zhubei (TW)

(72) Inventor: Ho-Chien Wu, Zhubei (TW)

(73) Assignee: Shih Hua Technology Ltd., Zhubei, Hsinchu County (TW)

( * ) Notice: Subject to any disclaimer, the term of this patent is extended or adjusted under 35 U.S.C. 154(b) by 0 days.

(21) Appl. No.: 13/653,460

(22) Filed: Oct. 17, 2012

(65) Prior Publication Data
US 2013/0170153 A1 Jul. 4, 2013

(30) Foreign Application Priority Data

Jan. 2, 2012 (TW) .............................. 101100113 A

(51) Int. Cl.
*H05K 7/00* (2006.01)
(52) U.S. Cl.
USPC ........................................................ 361/777
(58) Field of Classification Search
USPC ........... 361/777, 760, 778, 779, 748; 174/250
See application file for complete search history.

(56) References Cited

U.S. PATENT DOCUMENTS

| 6,512,187 B2 * | 1/2003 | Sumida et al. ................ 174/261 |
| 2012/0312677 A1 * | 12/2012 | Kuriki .......................... 200/600 |

* cited by examiner

*Primary Examiner* — Timothy Thompson
*Assistant Examiner* — Andargie M Aychillhum
(74) *Attorney, Agent, or Firm* — Altis & Wispro Law Group, Inc.

(57) ABSTRACT

A printed circuit includes a number of conductive wires. The conductive wires include at least one first conductive wire section, at least one second conductive wire section, and at least one first connection section. An angle between the at least one first conductive wire section and the at least one first connection section is defined as angle $\alpha_n$, the angle $\alpha_n$ is in a range from about 90 degrees to about 180 degrees. An angle between the at least one second conductive wire section and the at least one first connection section is defined as angle $\beta_n$, the angle $\beta_n$ is in a range from about 90 degrees to about 180 degrees. The angle $\alpha_n$ and $\beta_n$ are not simultaneously be 180 degrees. $\alpha_n-\alpha_{n-1}\neq 0$, $\beta_n-\beta_{n-1}\neq 0$, wherein n is the number of the plurality of conductive wires.

21 Claims, 7 Drawing Sheets

PRINTED CIRCUIT AND PRINTED CIRCUIT OF TOUCH PANEL

RELATED APPLICATIONS

This application claims all benefits accruing under 35 U.S.C. §119 from Taiwan Patent Application No. 101100112, filed on Jan. 2, 2012 in the Taiwan Intellectual Property Office, the disclosure of which is incorporated herein by reference.

BACKGROUND

1. Technical Field

The present application relates to a printed circuit and particularly a printed circuit for a touch panel.

2. Discussion of Related Art

For faster printing speeds and lower cost, the screen printing technique is widely used in printing circuits. As line width and space between two adjacent lines of a printed circuit become increasingly smaller, the yields of the printed circuit may significantly decrease. FIG. 6 and FIG. 7 illustrate printed circuits including a plurality of tracks or traces with corners of right angles or rounded corners. In the actual process for making the printed circuits as shown in FIG. 6 or FIG. 7, the screen will also include multiple right angles or rounded corners. When silver colloid is applied through the right angles or rounded corners on the screen during making the printed circuits as shown in FIG. 6 or FIG. 7, the silver colloid may spill over the edges of the screen which will result in two adjacent tracks short circuiting. Manufacturing yields of the printed circuits are significantly reduced because of spilling of the silver colloid over the edges of the screen.

What is needed, therefore, is to provide a printed circuit and a printed circuit of a touch panel which can overcome the shortcomings as described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
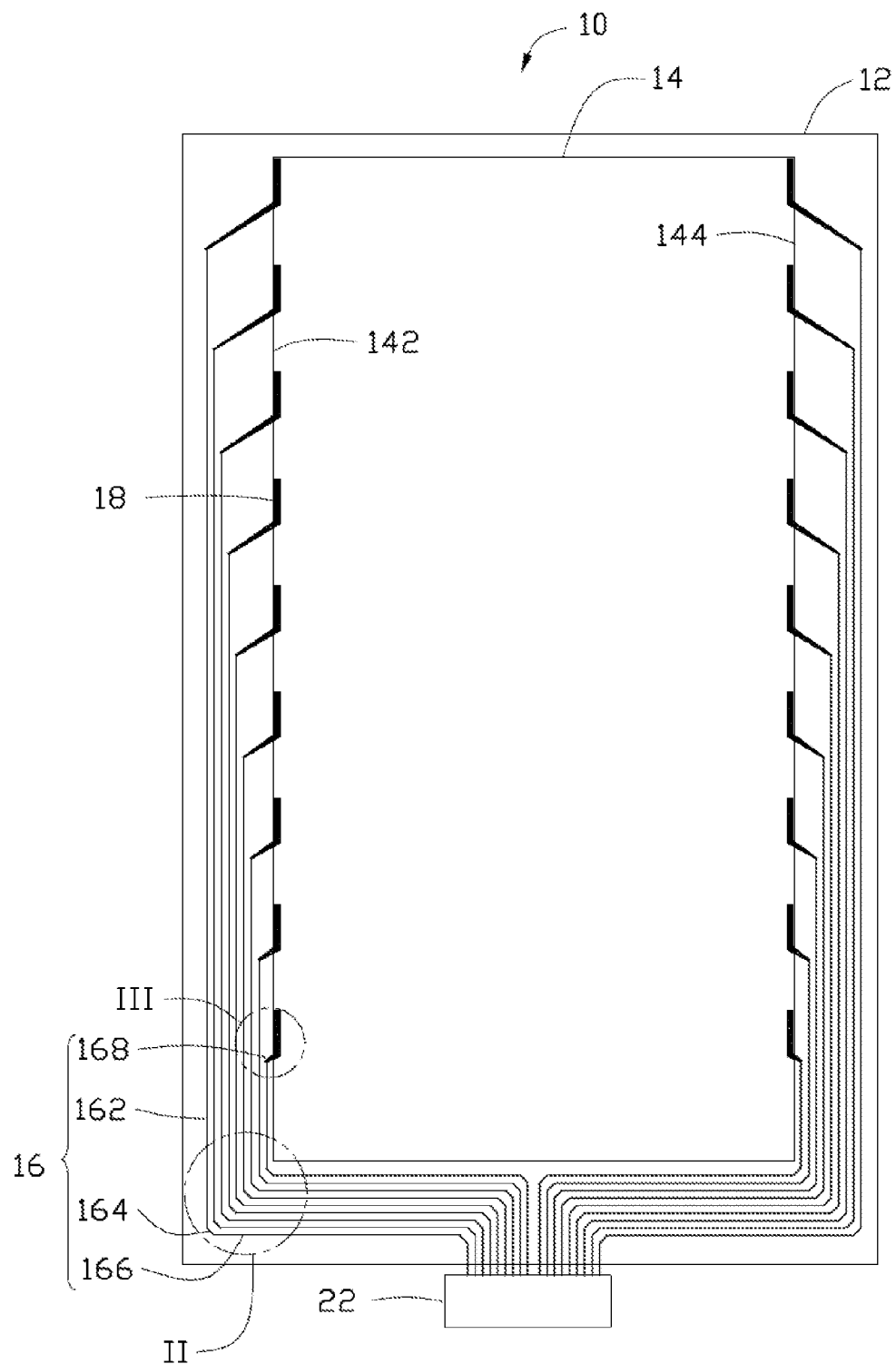
FIG. 1 is a schematic view showing a structure of one embodiment of a printed circuit of a touch panel.

Referring to FIG. 1, a printed circuit 10 of a touch panel of one embodiment includes a plurality of conductive wires 16. The touch panel includes a substrate 12, a transparent conductive layer 14, and a plurality of electrodes 18.

The transparent conductive layer 14, the plurality of conductive wires 16, and the plurality of electrodes 18 are located on a surface of the substrate 12. The transparent conductive layer 14 is located on the surface of the substrate 12. The transparent conductive layer 14 includes a first side 142 and a second side 144 opposite to and parallel to the first side 142. The plurality of electrodes 18 are outside the first and the second sides 142 and 144 of the transparent conductive layer 14. The plurality of electrodes 18 are spaced from each other and electrically connected with the transparent conductive layer 14. The plurality of electrodes 18 located on the first side 142 of the transparent conductive layer 14 are spaced from each other and electrically connected to the transparent conductive layer 14. The plurality of electrodes 18 located on the second side 144 of the transparent conductive layer 14 are spaced from each other and electrically connected to the transparent conductive layer 14. Each of the plurality of electrodes 18 on the first side 142 of the transparent conductive layer 14 matches one of the plurality of electrodes 18 on the second side 144 of the transparent conductive layer 14.

The plurality of conductive wires 16 can be divided into two parts according to the location. The first part of the plurality of conductive wires 16 is located adjacent to the first side 142 of the transparent conductive layer 14. The second part of the plurality of conductive wires 16 is located adjacent to the second side 144 of the conductive layer 14. One end of the first part of the plurality of conductive wires 16 is connected to one of the plurality of electrodes 18, the other end of the first part of the plurality of conductive wires 16 is connected to an external circuitry 22. One end of the second part of the plurality of conductive wires 16 is connected to one of the plurality of electrodes 18, the other end of the second part of the plurality of conductive wires 16 is connected to the external circuitry 22. The first part of the plurality of conductive wires 16 is parallel to each other. The second part of the plurality of conductive wires 16 is parallel to each other and spaced from each other. Each of the plurality of conductive wires 16 is electrically independent and insulated from each other. There is a distance between every adjacent two of the plurality of conductive wires 16. A width of each of the plurality of conductive wires 16 can be in a range from about 50 microns to about 200 microns. The transparent conductive layer 14 receives connections to the external circuitry 22 by the plurality of electrodes 18 and the plurality of conductive wires 16.

In operation, the external circuitry 22 provides driving signals to the transparent conductive layer 14 via the plurality of conductive wires 16 and the plurality of electrodes 18. When the transparent conductive layer 14 is touched by a finger or by a conductive material, a conductive or capacitive path is formed between the transparent conductive layer 14 and the finger or conductive material. The conduction or capacitance is transmitted to the external circuitry by the plurality of conductive wires 16 and the plurality of electrodes 18, and a location of the finger or the conductive material can be sensed.

The plurality of conductive wires 16 can be made by a method such as screen printing. The plurality of conductive wires 16 can be made of conductive material such as a metal, or a conductive silver paste.

The distribution of the plurality of conductive wires 16 located adjacent to the first side 142 of the transparent conductive layer 14, is the same as the distribution of the plurality of conductive wires 16 located adjacent to the second side 144 of the transparent conductive layer 14. The plurality of conductive wires 16 located adjacent to the first side 142 of the transparent conductive layer 14 are described for exemplary purposes. Each of the plurality of conductive wires 16 includes at least two corners. In one embodiment, the two corners are labeled as circled portion II and circled portion III.

Figure 2:
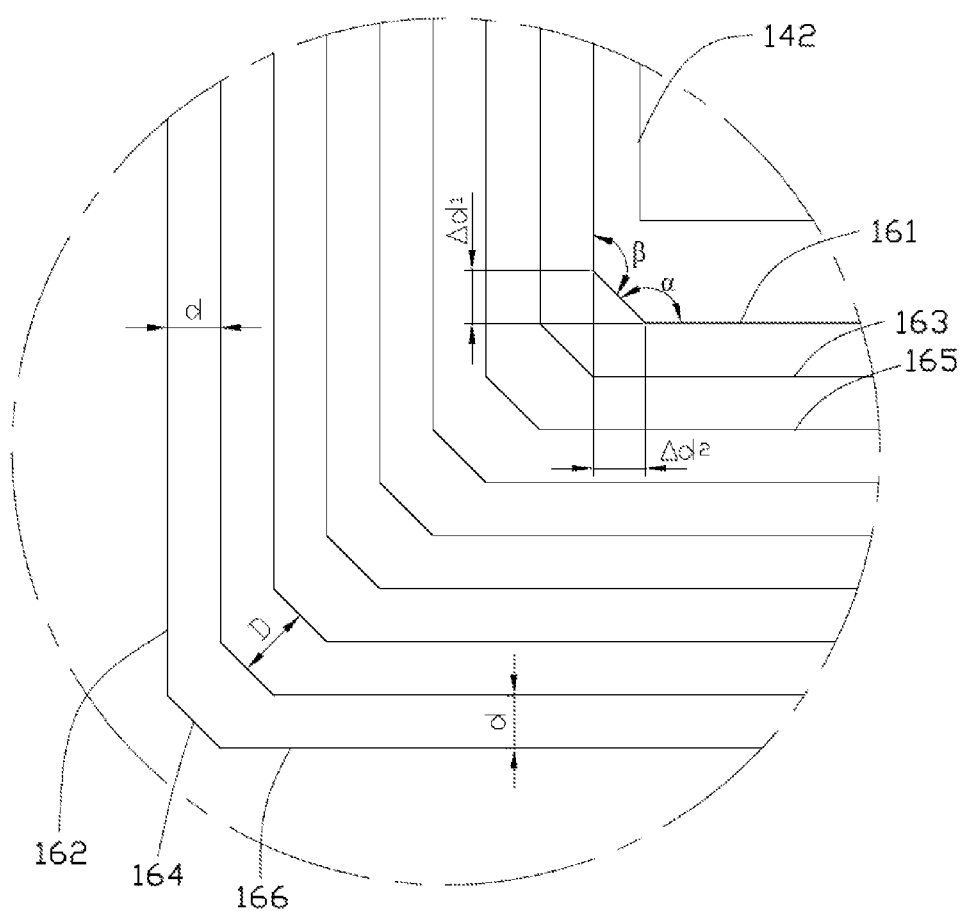
FIG. 2 is a schematic, enlarged view of circled portion II of the printed circuit in FIG. 1.

Referring to FIG. 2, each of the plurality of conductive wires 16 includes a first conductive wire section 162, a second conductive wire section 166, a first connection section 164, and a second connection section 168.

In circled portion II, the first conductive wire section 162 is connected to the second conductive wire section 166 by the first connection section 164. Each of the first conductive wire sections 162 is parallel to each other. Each of the second conductive wire section 166 is also parallel to each other. There is an angle between an extending line of the first conductive wire section 162 and an extending line of the second conductive wire section 166. The angle can be in a range from about 0 degrees to about 180 degrees. Each of the first connection section 164 is in a straight line and parallel to each other. There is an angle between the first conductive wire section 162 and the first connection section 164, and the angle is defined as $\alpha$. There is an angle between the second conductive wire section 166 and the first connection section 164, and the angle is defined as $\beta$. The angles $\alpha$ and $\beta$ are located at each end of the first connection section 164. The angles $\alpha$ and $\beta$ can be in a range from about 90 degrees to about 180 degrees. In one embodiment, the angles $\alpha$ and $\beta$ are in a range from about 120 degrees to about 150 degrees. In one embodiment, the angles $\alpha$ and $\beta$ are in a range from about 130 to about 140 degrees.

In one embodiment, the extending line of the first conductive wire section 162 is perpendicular to the extending line of the second conductive wire section 166. A distance between any adjacent two of the first connection sections 164 can be equal or unequal. In one embodiment, the distance between any adjacent two of the first connection sections 164 is equal and defined as D. A distance between adjacent two of the first conductive wire sections 162 is defined as d, which is the same distance as that between adjacent two of the second conductive wire sections 166. The distance d can be in a range from about 50 microns to about 200 microns.

The first conductive wire section 162 includes a first end and a second end opposite to the first end. The first end of the first conductive wire section 162 is connected to the first connection section 164. The second conductive wire section 166 includes a first end and a second end opposite to the first end. The first end of the second conductive wire section 166 is connected to the other end of the first connection section 164.

In each adjacent two of the plurality of conductive wires 16, a distance between the first end of the first conductive wire section 162 far away from the first side 142 and an orthographic projection of the first end of the first conductive wire section 162 close to the first side 142 is defined as $\Delta d_1$, wherein the orthographic projection is on the first conductive wire section 162 far away from the first side 142. In each adjacent two of the plurality of conductive wires 16, a distance between the first end of the second conductive wire section 166 far away from the first side 142 and an orthographic projection of the first end of the second conductive wire section 166 close to the first side 142 is defined as $\Delta d_2$, wherein the orthographic projection is on the second conductive wire section 166 far away from the first side 142. Therefore, the distance between adjacent two of the first connection sections 164 is larger than the distance between adjacent two of the first conductive wire sections 162. The distance between adjacent two of the first connection sections 164 is similarly larger than the distance between adjacent two of the second conductive wire sections 166. D is larger than d. This achieves the result that any short circuiting between the adjacent two of the plurality of conductive wires 16 in the circled portion II is almost impossible.

Three of the plurality of conductive wires 16 close to the first side 142 of the transparent conductive layer 14 can be taken as an example, these are sequentially named as a conductive wire 161, a conductive wire 163, and a conductive wire 165, as shown in FIG. 2. The conductive wire 161 is the closest to the first side 142 of the transparent conductive layer 14.

A distance between the first end of the conductive wire 163 and an orthographic projection of the first end of the first conductive wire section 162 of the conductive wire 161 on the conductive wire 163 is defined as $\Delta d_1$. A distance between the first end of the conductive wire 165 and an orthographic projection of the first end of the first conductive wire section 162 of the conductive wire 163 on the conductive wire 165 is also defined as $\Delta d_1$.

A distance between the first end of the conductive wire 163 and an orthographic projection of the first end of the second conductive wire section 166 of the conductive wire 161 on the conductive wire 163 is defined as $\Delta d_2$. A distance between the first end of the conductive wire 165 and an orthographic projection of the first end of the second conductive wire section 166 of the conductive wire 163 on the conductive wire 165 is also defined as $\Delta d_2$. The distances $\Delta d_1$ and $\Delta d_2$ can be equal or unequal. In one embodiment, $\Delta d_1$, $\Delta d_2$ and d are all equal.

The distances between adjacent two of the first connection sections 164 meet the condition: $D=\sqrt{2}\Delta d_1 \times \sin(225°-\alpha)$. The angle $\alpha$ plus $\beta$ equals 270 degrees. In one embodiment, the angles $\alpha$ and $\beta$ are 135 degrees. In one embodiment, angles $\alpha$ and $\beta$ are equal to 135 degrees, $\Delta d_1$ and $\Delta d_2$ are equal to d. Therefore, the distance between adjacent two of the first connection sections 164 meets the condition: $D=\sqrt{2}d$. When $\Delta d_1$ is larger than d, D is larger than $\sqrt{2}d$.

In one embodiment, in the process of printing the printed circuit 10 by a screen printing process, when a silver colloid is applied through the angle $\alpha$ or $\beta$, the silver colloid has a smaller impact through the screen. Therefore, the silver colloid does not readily overflow from the circled portion II, reducing the likelihood of short circuits. Moreover, the manufacturing yield of such a printed circuit 10 is significantly increased.

Figure 3:
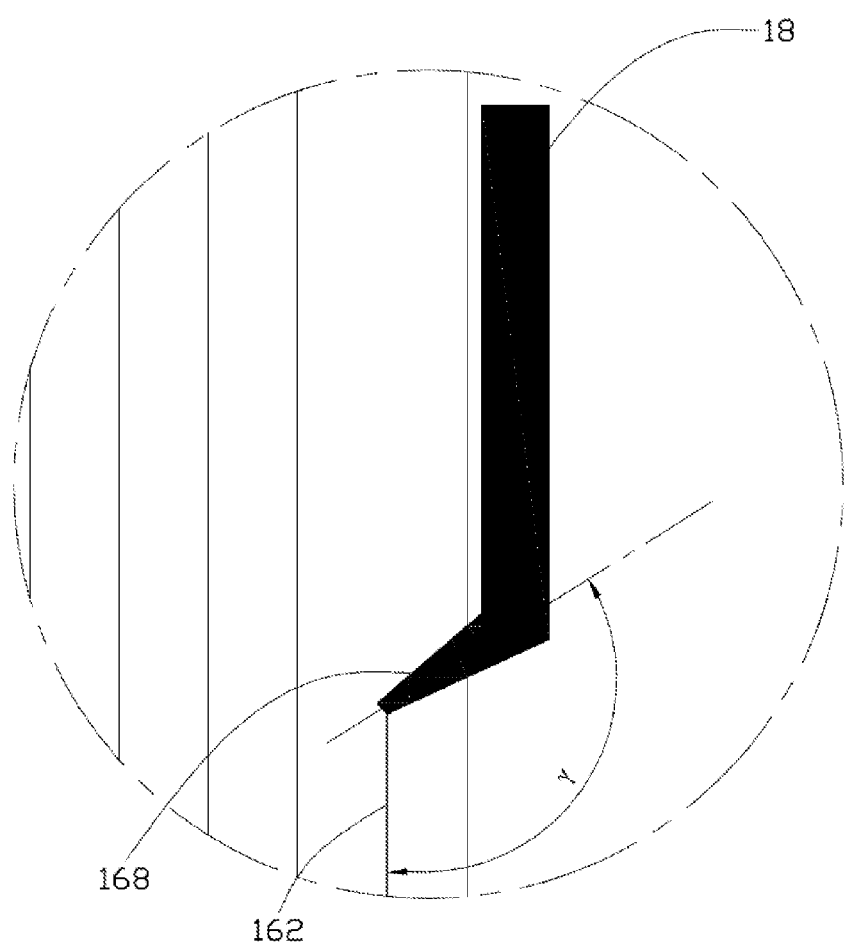
FIG. 3 is a schematic, enlarged view of circled portion III of the printed circuit in FIG. 1.

Referring to FIG. 3, in the circled portion III, each of the second connection section 168 includes a first end and a second end opposite to the first end. The first end of the second connection section 168 is electrically connected to the second end of the first conductive wire section 162. The second end of the second connection section 168 is electrically connected to the plurality of electrodes 18. An angle between the second connection section 168 and the first conductive wire section 162 is defined as $\gamma$. The angle $\gamma$ can be in a range from about 90 degrees to about 180 degrees. In one embodiment, the angle $\gamma$ is in a range from about 120 degrees to about 150 degrees. In another embodiment, the angle $\gamma$ is in a range from about 130 degrees to about 140 degrees. In another embodiment, the angle $\gamma$ is 135 degrees. A width of the connection section 168 is larger than the width of the first conductive wire section 162. Therefore, an open circuit phenomenon is less likely to occur between the second connection section 168 and the first conductive wire section 162. The yield of the printed circuit 10 can be improved. In one embodiment, the width of second connection section 168 is in a range from about 50 microns to about 1000 microns.

Figure 4:
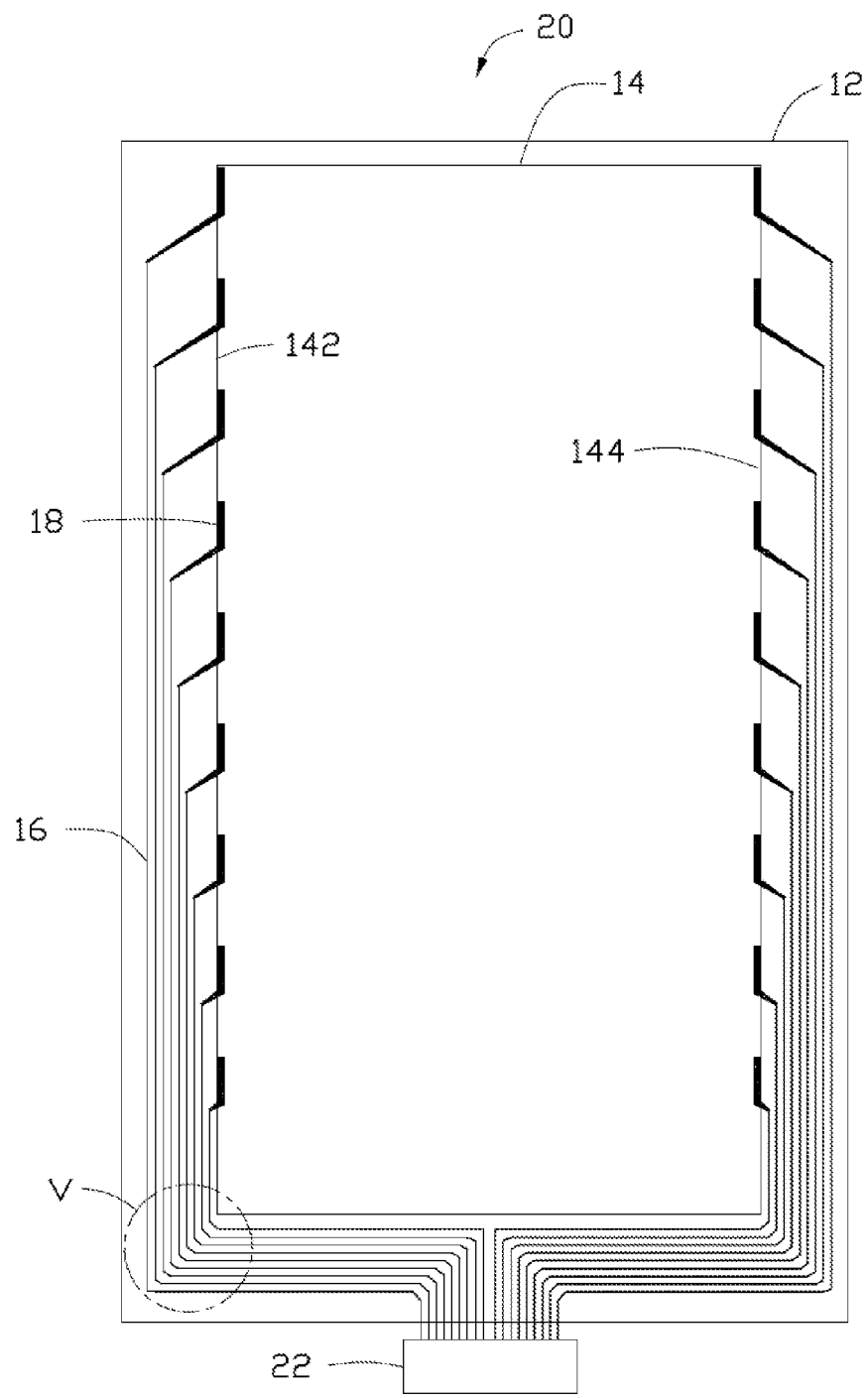
FIG. 4 is a schematic view showing a structure of another embodiment of a printed circuit of a touch panel.
Figure 5:
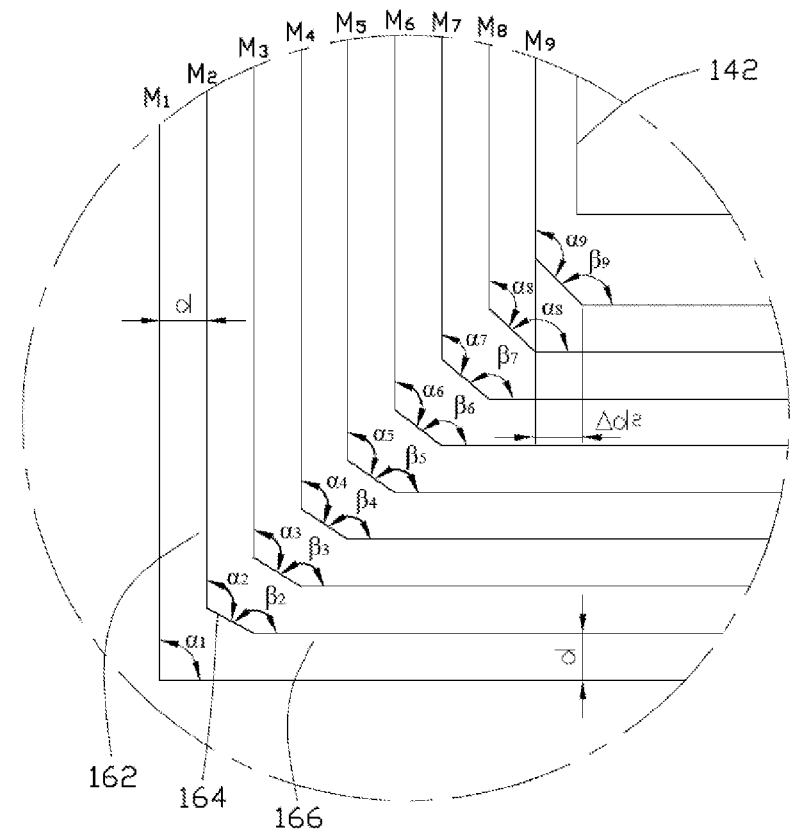
FIG. 5 is a schematic, enlarged view of circled portion V of the printed circuit in FIG. 4.
Figure 6:
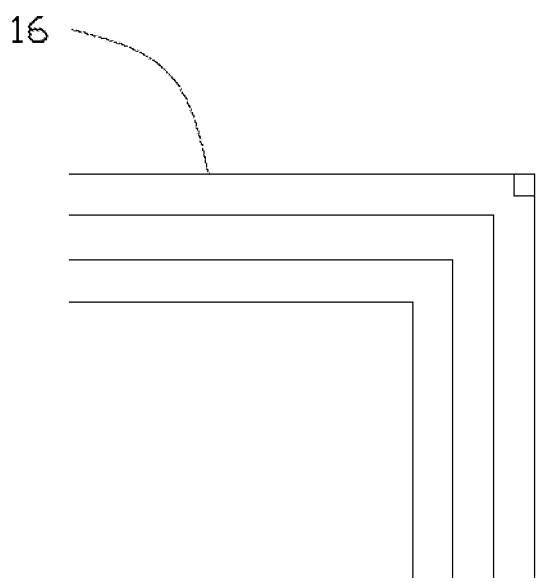
FIG. 6 is a schematic view showing a structure of a printed circuit of prior art in one corner.
Figure 7:
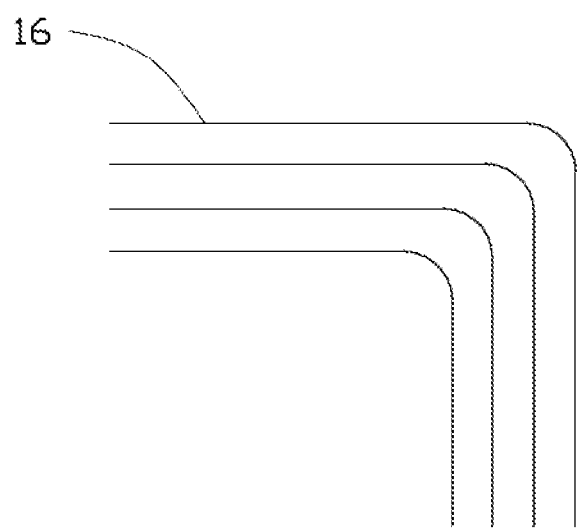
FIG. 7 is a schematic view showing another structure of a printed circuit of prior art in one corner.

Referring to FIG. 4 and FIG. 5, a printed circuit 20 of a touch panel of another embodiment includes the plurality of conductive wires 16. The printed circuit 20 is similar to the printed circuit 10. The difference between the printed circuit 20 and the printed circuit 10 is that in the printed circuit 20, each of the plurality of conductive wires 16 includes at least one corner defined as V.

An angle between the first conductive wire section 162 and the first connection section 164 is defined as $\alpha_n$. An angle between the second conductive wire section 166 and the first connection section 164 is defined as $\beta_n$. The angles $\alpha_n$ and $\beta_n$ are at either end of the first connection section 164. The angles $\alpha_n$ and $\beta_n$ can be in a range from about 90 degrees to about 180 degrees. The angles $\alpha_n$ and $\beta_n$ can not both be 180 degrees. The angle $\alpha_n$ meets the condition: $\alpha_n - \alpha_{n-1} \neq 0$, wherein the letter n represents $\beta_n - \beta_{n-1} \neq 0$, wherein the letter n represents the number of the plurality of conductive wires 16.

In each adjacent two of the plurality of conductive wires 16, a distance between the first end of the second conductive wire section 166 far away from the first side 142 and an orthographic projection of the first end of the second conductive wire section 166 close to the first side 142 is defined as $\Delta d_2$, wherein the orthographic projection is on the second conductive wire section 166 far away from the first side 142. In one embodiment, the distance $\Delta d_2$ is equal to the distance d. The angle $\alpha_n$ successively decreases in a direction far away from the first side 142. At the same time, the angle $\beta_n$ successively increases in the direction far away from the first side 142. The angle $\alpha_n$ meets the condition: $\alpha_n - \alpha_{n-1} = 45°/n-1$. The angle $\beta_n$ meets the condition: $\beta_{n-1} - \alpha_n = 45°/n-1$.

In one embodiment, there are nine conductive wires 16. The nine conductive wires 16 are named as conductive wire $M_1$, conductive wire $M_2$, conductive wire $M_3$, conductive wire $M_4$, conductive wire $M_5$, conductive wire $M_6$, conductive wire $M_7$, conductive wire $M_8$ and conductive wire $M_9$. So that, $\alpha_n - \alpha_{n-1} = 45°/9-1 = 5.625°$, and $\beta_{n-1} - \alpha_n = 45°/9-1 = 5.625°$.

In detail, in the conductive wire $M_1$, an angle $\alpha_1$ between the first conductive wire section 162 and the first connection section 164 is equal to 90 degrees; an angle $\beta_1$ between the second conductive wire section 166 and the first connection section 164 is equal to 180 degrees. In the conductive wire $M_1$, the first conductive wire section 162 is perpendicular to the second conductive wire section 166.

In the conductive wire $M_2$, there is an angle $\alpha_2$ between the first conductive wire section 162 and the first connection section 164, and the angle $\alpha_2$ meets the equation: $\alpha_2 = 90° + 5.625° = 95.625°$; there is an angle $\beta_2$ between the second conductive wire section 166 and the first connection section 164, and the angle $\beta_2$ meets the equation: $\beta_2 = 180° - 5.625° = 174.375°$.

In the conductive wire $M_3$, there is an angle $\alpha_3$ between the first conductive wire section 162 and the first connection section 164, and the angle $\ominus_3$ meets the equation: $\alpha_3 = 95.625° + 5.625° = 101.25°$; there is an angle $\beta_3$ between the second conductive wire section 166 and the first connection section 164, and the angle $\beta_3$ meets the equation: $\beta_3 = 174.375° - 5.625° = 167.75°$.

In the conductive wire $M_4$, there is an angle $\alpha_4$ between the first conductive wire section 162 and the first connection section 164, and the angle $\alpha_4$ meets the equation: $\alpha_4 = 101.25° + 5.625° = 106.875°$; there is an angle $\beta_4$ between the second conductive wire section 166 and the first connection section 164, and the angle $\beta_4$ meets the equation: $\beta_4 = 168.75° - 5.625° = 163.125°$.

In the conductive wire $M_5$, there is an angle $\alpha_5$ between the first conductive wire section 162 and the first connection section 164, and the angle $\alpha_5$ meets the equation: $\alpha_5 = 106.875° + 5.625° = 112.5°$; there is an angle $\beta_5$ between the second conductive wire section 166 and the first connection section 164, and the angle $\beta_5$ meets the equation: $\beta_5 = 163.125° - 5.625° = 157.5°$.

In the conductive wire $M_6$, there is an angle $\alpha_6$ between the first conductive wire section 162 and the first connection section 164, and the angle $\alpha_6$ meets the equation: $\alpha_6 = 112.5° + 5.625° = 118.125°$; there is an angle $\beta_6$ between the second conductive wire section 166 and the first connection section 164, and the angle $\beta_6$ meets the equation: $\beta_6 = 157.5° - 5.625° = 151.875°$.

In the conductive wire $M_7$, there is an angle $\alpha_7$ between the first conductive wire section 162 and the first connection section 164, and the angle $\alpha_7$ meets the equation: $\alpha_7 = 118.125° + 5.625° = 123.75°$; there is an angle $\beta$ between the second conductive wire section 166 and the first connection section 164, and the angle $\beta$ meets the equation: $\beta_7 = 151.875° - 5.625° = 146.25°$.

In the conductive wire Mg, there is an angle $\alpha_8$ between the first conductive wire section 162 and the first connection section 164, and the angle $\alpha_8$ meets the equation: $\alpha_8 = 123.75° + 5.625° = 129.375°$; there is an angle $\beta_8$ between the second conductive wire section 166 and the first connection section 164, and the angle $\beta_8$ meets the equation: $\beta_8 = 146.25° - 5.625° = 140.625°$.

In the conductive wire $M_9$, there is an angle $\alpha_9$ between the first conductive wire section 162 and the first connection section 164, and the angle $\alpha_9$ meets the equation: $\alpha_9 = 129.375° + 5.625° = 135°$; there is an angle $\beta_9$ between the second conductive wire section 166 and the first connection section 164, and the angle $\beta_9$ meets the equation: $\beta_9 = 140.625° - 5.625° = 135°$.

Moreover, the angle $\alpha_n$ also meets the condition: $\alpha_{n-1} - \alpha_n = 45°/n-1$. The angle $\beta_n$ meets a similar condition: $\alpha_n - \alpha_{n-1} = 45°/n-1$. That is, the angle $\alpha_n$ successively increases in the direction far away from the first side 142. At the same time, the angle $\beta_n$ successively decreases in the direction far away from the first side 142.

The angles $\alpha_n$ and $\beta_n$ in the circled portion V can be changed using various algorithms, for example, a ratio, a difference value, or more complex forms. The angle $\alpha_n$ has to be larger than 90 degrees, and the angle $\beta_n$ has to be larger than 90 degrees.

Changing of the angles $\alpha_n$ and $\beta_n$ in the circled portion V enables the distance between adjacent two of the first connection sections 164 in the circled portion V to be larger than the distance between adjacent two of the first connection sections 164 in the circled portion II. Therefore, the likelihood of short circuit phenomenon between adjacent two of the plurality of conductive wires 16 is further reduced.

The arrangement of the plurality of conductive wires 16 is not limited to the touch screen only, and other electronic products which include the printed circuit 10 can also utilize the arrangement of the plurality of conductive wires 16.

In summary, at least two angles are formed in at least one corner of the plurality of conductive wires 16. In the process of printing the printed circuits 10 or 20 by the screen printing process, when the silver colloid is applied through the angles, the silver colloid has a smaller impact on and through the screen. Therefore, the silver colloid is less likely to blur and overflow from the corner, leading adjacent two of the plurality of conductive wires 16 away from short circuiting. Moreover, the distance between adjacent two of the plurality of conductive wires 16 can be increased, further preventing the occurrence of a short circuit between adjacent two of the plurality of conductive wires 16. Thus, the yield of the printed circuits 10 or 20 can significantly increase. In addition, the structure of the printed circuits 10 and 20 is simple and easy to implement.

The above-described embodiments are intended to illustrate rather than to limit the disclosure. Variations may be made to the embodiment without departing from the spirit of the disclosure as claimed. The above-described embodiments are intended to illustrate the scope of the disclosure and not to restrict the scope of the disclosure.

The above description and the claims drawn to a method may include some indication in reference to certain steps. However, any such indication is only for identification purposes and is not to be taken as a suggestion as to an order for the steps.

What is claimed is:

1. A printed circuit of a touch panel, comprising:
a plurality of conductive wires, a number of the plurality of conductive wires being an integral n, each of the plurality of conductive wires comprising a first end and a second end opposite to the first end, wherein the first end is connected to a plurality of electrodes of the touch panel, the second end is connected to an external circuitry; each of the plurality of conductive wires comprising a first conductive wire section, a second conductive wire section, and a first connection section; the first connection section extends along a straight line; the first connection section comprises a first end and a second end opposite to the first end of the first connection, the first end of the first connection section is connected to the first conductive wire section, the second end of the first connection section is connected to the second conductive wire section; the first conductive wire section of each of the plurality of conductive wires is parallel to each other, the second conductive wire section of each of the plurality of conductive wires is parallel to each other; an angle between the first conductive wire section of an $n^{th}$ conductive wire of the plurality of conductive wires and the first connection section of the $n^{th}$ conductive wire is defined as angle $\alpha_n$, the angle $\alpha_n$ is in a range from about 90 degrees to about 180 degrees; an angle between the second conductive wire section of the $n^{th}$ conductive wire and the first connection section of the $n^{th}$ conductive wire is defined as angle $\beta_n$, the angle $\beta_n$ is in a range from about 90 degrees to about 180 degrees; the angle $\alpha_n$ and the angle $\beta_n$ are in a same side of the first connection section; the angle $\alpha_n$ and $\beta_n$ are not simultaneously 180 degrees; and $\alpha_n - \alpha_{n-1} \neq 0$, $\beta_n - \beta_{n-1} \neq 0$.

2. The printed circuit of the touch panel as claimed in claim 1, wherein an extending direction of the first conductive wire section is perpendicular to an extending direction of the second conductive wire section.

3. The printed circuit of the touch panel as claimed in claim 1, wherein the angle $\alpha_n$ meets a condition of: $\alpha_n - \alpha_{n-1} = 45°/n-1$, and the angle $\beta_n$ meets a condition of: $\beta_{n-1} - \alpha_n = 45°/n-1$.

4. The printed circuit of the touch panel as claimed in claim 1, wherein the angle $\alpha_n$ meets a condition of: $\alpha_{n-1} - \alpha_n = 45°/n-1$, and the angle $\beta_n$ meets the condition of: $\beta_n - \alpha_{n-1} = 45°/n-1$.

5. The printed circuit of the touch panel as claimed in claim 1, wherein as n increases, the angle $\alpha_n$ gradually increases, and the angle $\beta_n$ gradually decreases.

6. The printed circuit of the touch panel as claimed in claim 1, wherein as n increases, the angle $\alpha_n$ gradually decreases, and the angle $\beta_n$ gradually increases.

7. The printed circuit of the touch panel as claimed in claim 1, wherein a distance between adjacent two of the first conductive wire sections is equal to a distance between adjacent two of the second conductive wire sections; the distance between the adjacent two of the first conductive wire sections and the distance between the adjacent two of the second conductive wire sections are defined as d, d is in a range from about 50 microns to about 200 microns.

8. The printed circuit of the touch panel as claimed in claim 1, wherein the each of the plurality of conductive wires further comprises a second connection section comprising a first end and a second end opposite to the first end of the second connection section, wherein the first end of the second connection section is connected to the first conductive wire section, the second end of the second connection section is connected to one of the plurality of electrodes; an angle between the second connection section and the first conductive wire section is defined as angle $\gamma$, the angle $\gamma$ is in a range from about 120 degrees to about 150 degrees.

9. The printed circuit of the touch panel as claimed in claim 8, wherein the angle $\gamma$ is in a range from about 130 degrees to about 140 degrees.

10. The printed circuit of the touch panel as claimed in claim 9, wherein the angle $\gamma$ is 135 degrees.

11. The printed circuit of the touch panel as claimed in claim 8, wherein a width of the second connection section is in a range from about 50 microns to about 1000 microns.

12. The printed circuit of the touch panel as claimed in claim 1, wherein a width of the each of the plurality of conductive wires is in a range from about 50 microns to about 200 microns.

13. A printed circuit, comprising:
a plurality of conductive wires, a number of the plurality of conductive wires being an integral n, each of the plurality of conductive wires comprising a first conductive wire section, a second conductive wire section, and a first connection section;
wherein the first connection section extends along a straight line, the first connection section comprises a first end and a second end opposite to the first end of the first connection section, the first end of the first connection section is connected to the first conductive wire section, the second end of the first connection section is connected to the second conductive wire section; each of the first conductive wire section is parallel to each other, each of the second conductive wire section is parallel to each other; an angle between the first conductive wire section of an $n^{th}$ conductive wire of the plurality of conductive wires and the first connection section of the $n^{th}$ conductive wire is defined as angle $\alpha_n$, the angle $\alpha_n$ is in a range from about 90 degrees to about 180 degrees; an angle between the second conductive wire section of the $n^{th}$ conductive wire and the first connection section of the $n^{th}$ conductive wire is defined as angle $\beta_n$, the angle $\beta_n$ is in a range from about 90 degrees to about 180 degrees; the angle $\alpha_n$ and the angle $\beta_n$ are in a same side of the first connection section; the angle $\alpha_n$ and $\beta_n$ are not simultaneously 180 degrees; and $\alpha_n - \alpha_{n-1} \neq 0$, $\beta_n - \beta_{n-1} \neq 0$.

14. The printed circuit as claimed in claim 13, wherein an extending direction of the first conductive wire section is perpendicular to an extending direction of the second conductive wire section.

15. The printed circuit as claimed in claim 13, wherein the angle $\alpha_n$ meets a condition of: $\alpha_n - \alpha_{n-1} = 45°/n-1$, and the angle $\beta_n$ meets a condition of: $\beta_{n-1} - \alpha_n = 45°/n-1$.

16. The printed circuit as claimed in claim 13, wherein as n increases, the angle $\alpha_n$ gradually increases, and the angle $\beta_n$ gradually decreases.

17. The printed circuit as claimed in claim 13, wherein as n increases, the angle $\alpha_n$ gradually decreases, and the angle $\beta_n$ gradually increases.

18. The printed circuit as claimed in claim 13, wherein a distance between adjacent two of the first conductive wire sections is equal to a distance between adjacent two of the second conductive wire sections; the distance between the adjacent two of the first conductive wire sections and the distance between the adjacent two of the second conductive wire sections are defined as d, d is in a range from about 50 microns to about 200 microns.

19. The printed circuit as claimed in claim 18, wherein a width of the second connection section is in a range from about 50 microns to about 1000 microns.

20. The printed circuit as claimed in claim 13, wherein the each of the plurality of conductive wires further comprises a second connection section comprising a first end and a second end opposite to the first end of the second connection section, wherein the first end of the second connection section is connected to the first conductive wire section, the second end of the second connection section is connected to one of the plurality of electrodes; an angle between the second connection section and the first conductive wire section is in a range from about 120 degrees to about 150 degrees.

21. The printed circuit as claimed in claim 13, wherein a width of each of the plurality of conductive wires is in a range from about 50 microns to about 200 microns.

* * * * *